United States Patent
Gregoritsch, Jr.

[11] Patent Number: 6,114,181
[45] Date of Patent: Sep. 5, 2000

[54] PRE BURN-IN THERMAL BUMP CARD ATTACH SIMULATION TO ENHANCE RELIABILITY

[75] Inventor: Albert John Gregoritsch, Jr., South Burlington, Vt.

[73] Assignee: International Business Machines Corporation, Armonk, N.Y.

[21] Appl. No.: 09/129,347

[22] Filed: Aug. 5, 1998

[51] Int. Cl.[7] .......................... G01R 31/26; H01L 21/66
[52] U.S. Cl. ................................ 438/15; 438/14; 438/17
[58] Field of Search .................................. 438/15, 14, 17

[56] References Cited

U.S. PATENT DOCUMENTS

| | | |
|---|---|---|
| 5,248,075 | 9/1993 | Young et al. . |
| 5,321,277 | 6/1994 | Sparks et al. . |
| 5,350,927 | 9/1994 | Rakhimov et al. . |
| 5,514,628 | 5/1996 | Enomoto et al. . |
| 5,519,193 | 5/1996 | Freiermuth et al. . |
| 5,554,940 | 9/1996 | Hubacher . |
| 5,593,903 | 1/1997 | Beckenbaugh et al. . |
| 5,747,101 | 5/1998 | Booth et al. . |
| 5,796,591 | 8/1998 | Dalal et al. . |
| 5,837,558 | 11/1998 | Zuniga et al. .......................... 438/127 |

Primary Examiner—Kevin M. Picardat
Assistant Examiner—D. M. Collins
Attorney, Agent, or Firm—Schmeiser, Olsen & Watts; James M. Leas

[57] ABSTRACT

The present invention provides a method for detecting integrated circuit component failures that would normally be triggered during the final card attach step of the manufacturing process. According to the preferred embodiments of the present invention, integrated circuit modules are subjected to an environment that simulates a card attach process step. The process step that simulates the card attach process is introduced into the fabrication process prior to the standard integrated circuit reliability testing procedures, thereby inducing or accelerating failure of certain weak modules and allowing for identification of faulty modules during the subsequent reliability testing steps.

21 Claims, 4 Drawing Sheets

PRE BURN-IN THERMAL BUMP CARD ATTACH SIMULATION TO ENHANCE RELIABILITY

BACKGROUND OF THE INVENTION

1. Technical Field

This invention generally relates to the field of semiconductor processing and integrated circuit manufacturing. More specifically, the present invention relates to a process for locating defective integrated circuit devices.

2. Background Art

Today, our society is heavily dependent on high-tech electronic devices for everyday activity. Integrated circuits are the components that give life to our electronic devices. Integrated circuits are found in widespread use throughout our country, in appliances, in televisions and personal computers, and even in automobiles. Additionally, modern manufacturing and production facilities are becoming increasingly dependent on the use of machines controlled by integrated circuits for operational and production efficiencies. Indeed, in many ways, our everyday life could not function as it does without integrated circuits. These integrated circuits are manufactured in huge quantities in our country and abroad. Improved integrated circuit manufacturing processes have led to drastic price reductions and performance enhancements for these devices.

The traditional integrated circuit fabrication process is a series of steps by which a geometric pattern or set of geometric patterns is transformed into an operational integrated circuit. An integrated circuit consists of superimposed layers of conducting, insulating, and device-forming materials. By arranging predetermined geometric shapes in each of these layers, an integrated circuit that performs the desired function may be constructed. The overall fabrication process consists of the patterning of a particular sequence of successive layers.

Integrated circuits are chemically and physically integrated into a substrate material, such as a silicon or gallium arsenide wafer, by combining electrically conductive, semi-conductive, and dielectric (insulating) layers or regions. The layers and regions are arranged to form electronic components or devices such as transistors, diodes, and capacitors. Millions of these devices are formed essentially simultaneously on the surface of a single wafer of semiconductor material during processing. Given the intricate nature of the fabrication process and the large number of devices formed during the typical fabrication process, it should not be surprising to note that certain defects can be introduced into the integrated circuits during the fabrication process.

Defects in integrated circuit structures may be caused by many factors. Some defects are due to imperfections in the underlying semiconductor crystalline structure while others are caused by imperfections in the physical structure of the circuit components and connections. For instance, a "dislocation" is a physical defect in the structure of the semiconductor crystal (typically silicon) at a very small scale. A dislocation may involve as few as four or five silicon atoms oriented differently than the other atoms in the crystal. A dislocation can impair the electrical function of a chip by causing threshold voltage shifts or leakage current. However, due to the nature of most dislocations, a dislocation is not easily detected. In addition, since the electrical activity of a dislocation defect can increase with the passage of time, the continued application of heat and voltage after fabrication can cause circuit failure.

In addition to those defects mentioned above, other defects may occur at contact points within a circuit or module. A contact point is the region located at the top or bottom of an opening between layers that allows an electrical contact to be made to individual layers. These contact points may become stressed during the fabrication process and develop an undesirable resistance to the passage of electrical current that may ultimately impede circuit performance. Ideally, these contact points will transmit an electrical current or signal with very little or no resistance. However, as these contact points develop increased resistance, they may eventually prevent the components within an integrated circuit from responding correctly. In an extreme case, a contact point may be so damaged as to create an open circuit, leading to an inoperative circuit or device. Damage to the contact points may be caused by stresses such as heating and cooling.

Another type of defect that can adversely affect circuit performance is called a "stacking fault." A stacking fault occurs when there are localized partial displacements of close-packed silicon planes that upset the normal crystal lattice structure. Stacking faults are common in integrated circuits and tend to increase as the device density increases.

Yet another common defect is known as a "high resistance strap." In general, a strap is a layer of doped polysilicon that is used as an interconnection between components of a chip. A strap may have a constriction or crack in the polysilicon that results in the strap having a higher than normal resistance.

Typically, in order to find defects in an integrated circuit, various types of "burn-in" testing can be performed. Burn-in testing consists of subjecting a circuit to a higher than normal voltage and temperature to stress the circuit components. Burn-in testing can be performed directly in-situ on the wafer, or at a later time such as when the individual integrated circuits have been packaged and incorporated into a finished module, component, or product. For example, once a wafer has been processed, the overall wafer is tested for defects. A probe device is connected to the contact pads for each die located on the periphery of the individual integrated circuits. This allows each integrated circuit to be connected to an electrical source and a reference ground to supply an operational current. The wafer is typically tested at voltage levels approximately 1.5 times the rated nominal value. For example, a typical circuit on a wafer may be designed to operate with a supplied voltage level of approximately 3.3 volts. Therefore, in this specific example of burn-in testing, the circuit will be operated at a voltage level of approximately 5–6 volts. This enhanced voltage level will create a flow of electricity and enhanced electric fields throughout the circuit which are greater than normal. While this stress is greater than the stress applied to the circuits during normal operations, the applied levels of current and the resulting electrical fields are controlled during burn-in testing so that they will not adversely affect the integrated circuit, but will only trigger defects so that they may be located and eliminated.

During the burn-in testing period, the circuitry on the wafer is electrically "exercised" or tested. However, due to the nature of certain defects, many of the defects listed above may not be readily apparent during standard burn-in testing. This is because the effects of many common defects increase only with the passage of time, or with the continued application of heat and/or voltage to the affected components.

There exists, therefore, a need to improve burn-in to identify additional defects to improve the reliability of the devices that are shipped to customers. Such a method would be financially beneficial to semiconductor manufacturers and would increase customer satisfaction in semiconductor products.

SUMMARY OF THE INVENTION

The present invention discovered that some failures are triggered by the application of heat when the semiconductor modules are assembled onto a card for use in an electronic device. This "card attach" process is done at a high ambient temperature, which stresses a module or the die and may accelerate the failure of certain already weakened components. Unfortunately, the card attach step is performed after burn-in is completed. While the burn-in testing process uses a voltage in excess of the normal operating voltage for a circuit and may be performed at a heightened temperature, it does not adequately simulate the conditions that occur during the card attach process and, therefore, does not trigger some failures that will be triggered during the card attach process. Thus, the typical burn-in cannot detect the many possible failures that may be triggered by the subsequent card attach process. This problem is further explained below.

Referring now to FIG. 1, a prior art method 100 for assembling and testing integrated circuit devices is shown. Method 100 typically includes several steps that are well known in the art. During the tape and die attach step (step 105) the die is attached to the lead frame with a piece of tape. At the die attach cure step (step 115) pressure and temperature are applied to permanently secure the die to the lead frame. The wire bond step (step 120) attaches the pad on the lead frame to the pad on the chip. During the adhesion promote step (step 125) the lead frame and die are cleaned and prepared to allow good adhesion at the subsequent steps. At the molding step (step 130), molding compound at a temperature high enough for the compound to exist in a fluid state is injected to encase the die and lead frame. The final cure step (step 135) cross links bonds in the molding compound to convert it into a solid state. The cleanup step (step 140) removes oxide and other material from the lead frame so that subsequent applications of solder may attach to the lead frame.

During the plating step (step 145) solder is attached to the lead frame. The first test step (step 150) is a simple test to verify structural integrity and proper assembly. The burn-in step (step 155) subjects the module to voltages in excess of standard operating voltages to trigger potential defects. The second test step (step 160) is a full test of module functionality. The marking step (step 165) consists of placing information such as fabricator information on the surface of the module. During the cure step (step 170) any ink used in marking the module is cured. At the scan, bake and tape step (step 175 the planarity and spacing of the module pins are examined for compliance with appropriate specifications, moisture possibly absorbed by the module is removed, and the module is placed on tape to be conveniently reeled prior to shipping. At the stock step (step 180) the modules are placed in storage and held for shipment. During the card attach step (step 185) the modules are attached to a card for inclusion in an electronic device.

As explained above, this presents a problem from a product reliability and SPQL stand point, as the heating required in card attach step (step 185) frequently weakens certain modules or components on the card. These weakened modules or components may cause the circuit to fail at some later date, once the card has been incorporated into a product and shipped to a customer. If these failure occurred earlier, they could be detected during burn-in. However, the sequencing of the prior-art process allows for circuit failures triggered during card attach to remain in the devices when shipped to customers.

Since failures triggered or accelerated by the card attach process cannot generally be detected during burn-in, these failures are typically identified by customers and users after the product containing the defective components have been shipped to the OEM fabricator or end-user. This is disadvantageous for two reasons. First, to repair or replace a failed component that is in the hands of the user is more costly than repairing or replacing a failed component during the manufacturing process. Second, failures that occur while a device is in the hands of a customer undermines customer confidence in a semiconductor manufacturer and can adversely impact quality evaluation criteria common in most supplier contracts. Customers typically expect a shipped product quality level ("SPQL") of twenty to fifty failures per million products. If too many card attach-related or other defects go undetected until product failure at the customer location, the SPQL may become unacceptable. However, as explained earlier, current testing procedures are inadequate for identifying failures triggered by the card attach process.

According to the present invention, an improved method for identifying potential circuit defects before shipment is disclosed. The present invention is a process for simulating the stresses associated with a typical card attach process prior to the burn-in testing stage. By subjecting the circuits and components to the card attach process, certain circuit failures that normally would not occur until the card attachment step of production may be identified during circuit burn-in. This early detection of circuit defects allows for the correction, replacement, or culling of faulty circuits, components and/or modules before shipment, resulting in considerable savings to the manufacturer. The present invention also allows the electronics manufacturer to substantially reduce the device failure rate experienced by customers, which will usually beneficially effect customer relations. According to the invention, the card attach process is simulated before the standard burn-in testing procedure occurs. The present invention contemplates introducing the integrated circuit modules into an environment that simulates the environment of the card attach process step. Subjecting the modules to the same stresses they will experience during the subsequent card attach process triggers failures in time for them to be identified during the standard burn-in testing sequence. The present invention, therefore, used in conjunction with standard testing techniques, greatly enhances the product reliability experienced by the customer without requiring a significant addition in costs to the manufacturer.

The foregoing and other features and advantages of the invention will be apparent from the following more particular description of preferred embodiments of the invention, as illustrated in the accompanying drawings.

BRIEF DESCRIPTION OF THE DRAWINGS

The preferred embodiments of the present invention will hereinafter be described in conjunction with the appended drawings, where like designations denote like elements, and.

BEST MODE FOR CARRYING OUT THE INVENTION

According to the preferred embodiments of the present invention, a method for triggering and detecting failures in integrated circuit devices is disclosed. The method of the present invention may be used to reduce the product failure rate experienced by customers in the field. By simulating card attach conditions prior to standard burn-in testing procedures, modules with certain defects can be identified and removed from the card fabrication and assembly process prior to being incorporated into final products.

Figure 2:
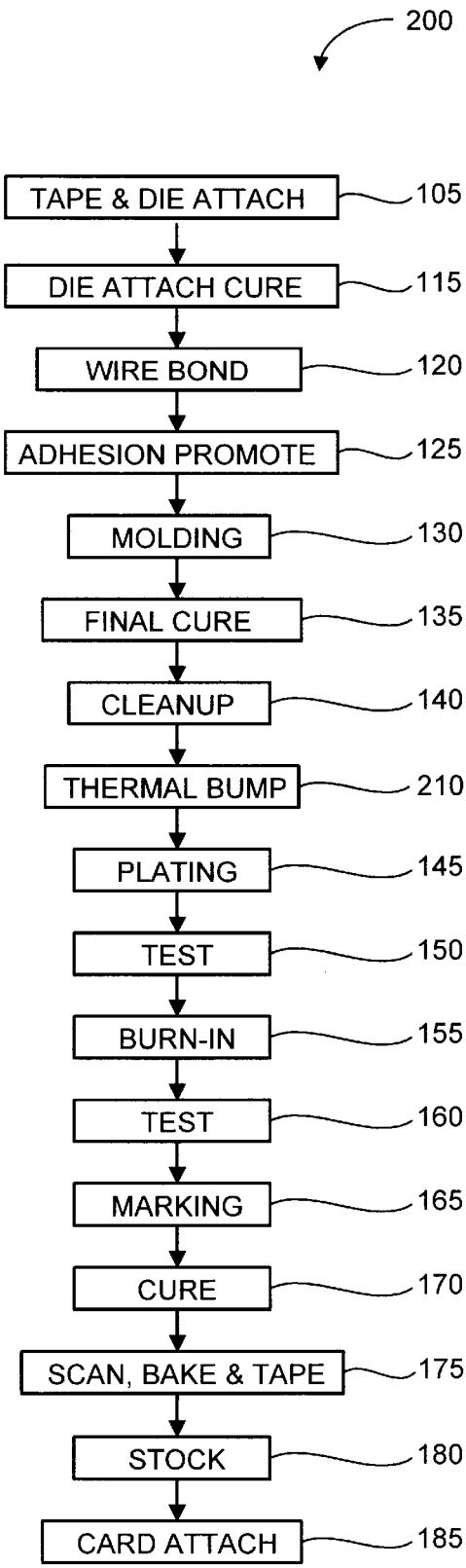
FIG. 2 is a flow diagram describing a semiconductor fabrication and testing method in accordance with a preferred embodiment of the present invention.

Referring now to FIG. 2, a method 200 for simulating card attach prior to standard burn-in testing in accordance with a preferred embodiment of a present invention is disclosed. The first embodiment introduces a new step into the typical device fabrication and testing process. Step 210, referred to as a "thermal bump" simulates the conditions that will be experienced by the components and modules on the card during card attach step (step 185). This process step is the same as the card attach step except that the modules are not attached to a card at this point. In method 200, the thermal bump (step 210) is introduced between the cleanup step (step 140) and the plating step (step 145) of method 100. It is important to note that the thermal bump (step 210) is performed at a significantly higher temperature than any other process step shown in method 200 of FIG. 2. Thus, the stresses of the card attach process step (step 185) are simulated prior to the burn-in step (step 155). This new step (step 210) triggers or accelerates circuit failures that would otherwise have been undetected during the burn-in testing step (step 155), presumably in time to be detected during the burn-in testing step (step 155). In the most preferred embodiment of the present invention, the integrated circuit modules are placed into an infrared oven or other heating source and the ambient temperature surrounding the integrated circuit modules is controlled so as to simulate the card attach process step.

Figure 1:
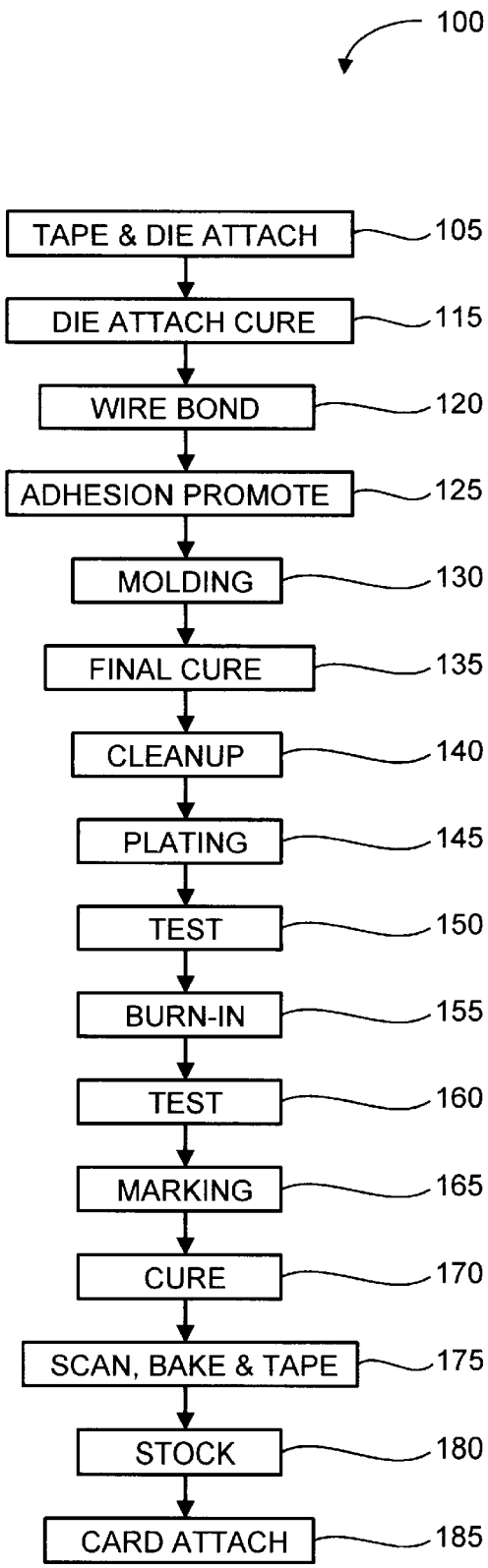
FIG. 1 is a flow diagram describing a typical semiconductor fabrication and testing method.
Figure 3:
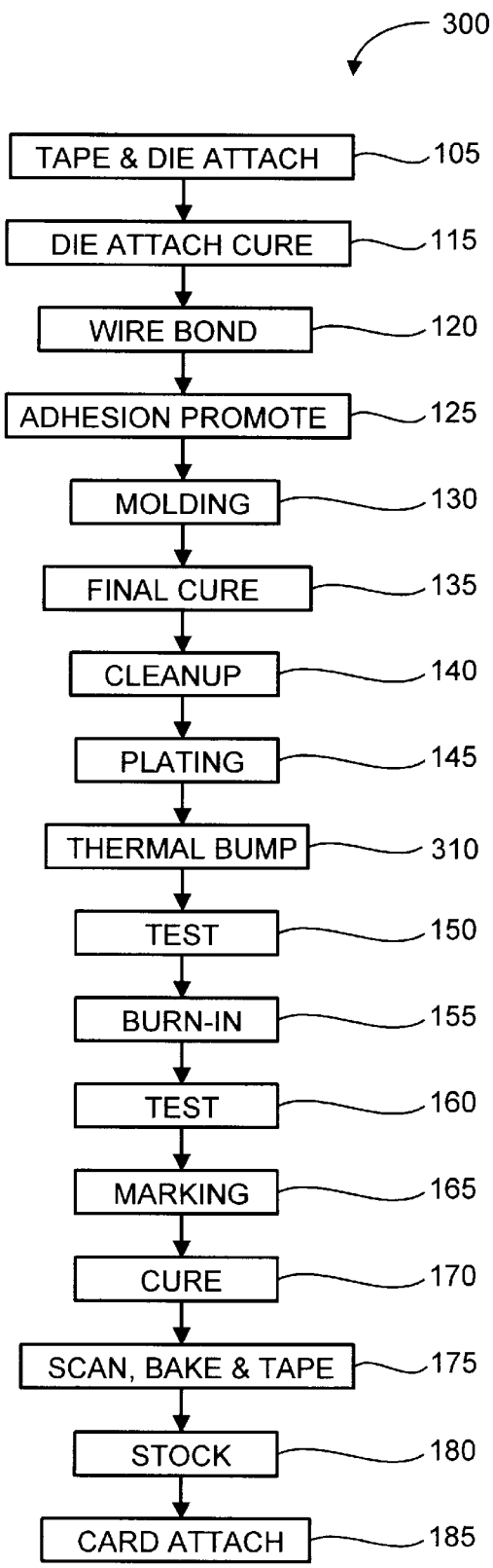
FIG. 3 is a flow diagram describing a semiconductor fabrication and testing method in accordance with an alternative preferred embodiment of the present invention.

Referring now to FIG. 3, a method 300 for simulating card attach prior to standard burn-in according to an alternative embodiment of the present invention is illustrated. In this alternative preferred embodiment the thermal bump step (step 310) is introduced between plating step (step 145) and first test step (step 150) of method 100 shown in FIG. 1. Method 300 still allows for the simulation of card attach step (step 185) stresses prior to circuit burn-in step (step 155). Thus, both method 200 and method 300 can trigger or accelerate failures prior to burn-in, rather than during the card attach process. While other integrated circuit manufacturing processes may use different process steps, the method of simulating the card attach process prior to burn-in testing may be readily adapted to other processes. Those skilled in the art will readily recognize that the two embodiments presented above are not limiting and that other, similar processes may be developed for simulating the card attach step of many other process environments. It is anticipated that the method of the present invention will be adapted to these other process environments.

Detecting the circuit failures that may be triggered by the stress associated with the card attach step (step 185) prior to shipment provides a distinct advantage to a semiconductor manufacturer. As mentioned above, customers typically expect a SPQL not greater than twenty to fifty failures per million products. This expected failure rate is quite low, and detecting failures that may be triggered by the card attach process before shipment can greatly improve a manufacturer's SPQL performance. At the same time, detecting such failures prior to shipment has a negligible impact upon production efficiency, as the standard burn-in and other typical testing processes already identify a large number of manufacturing defects.

Figure 4:
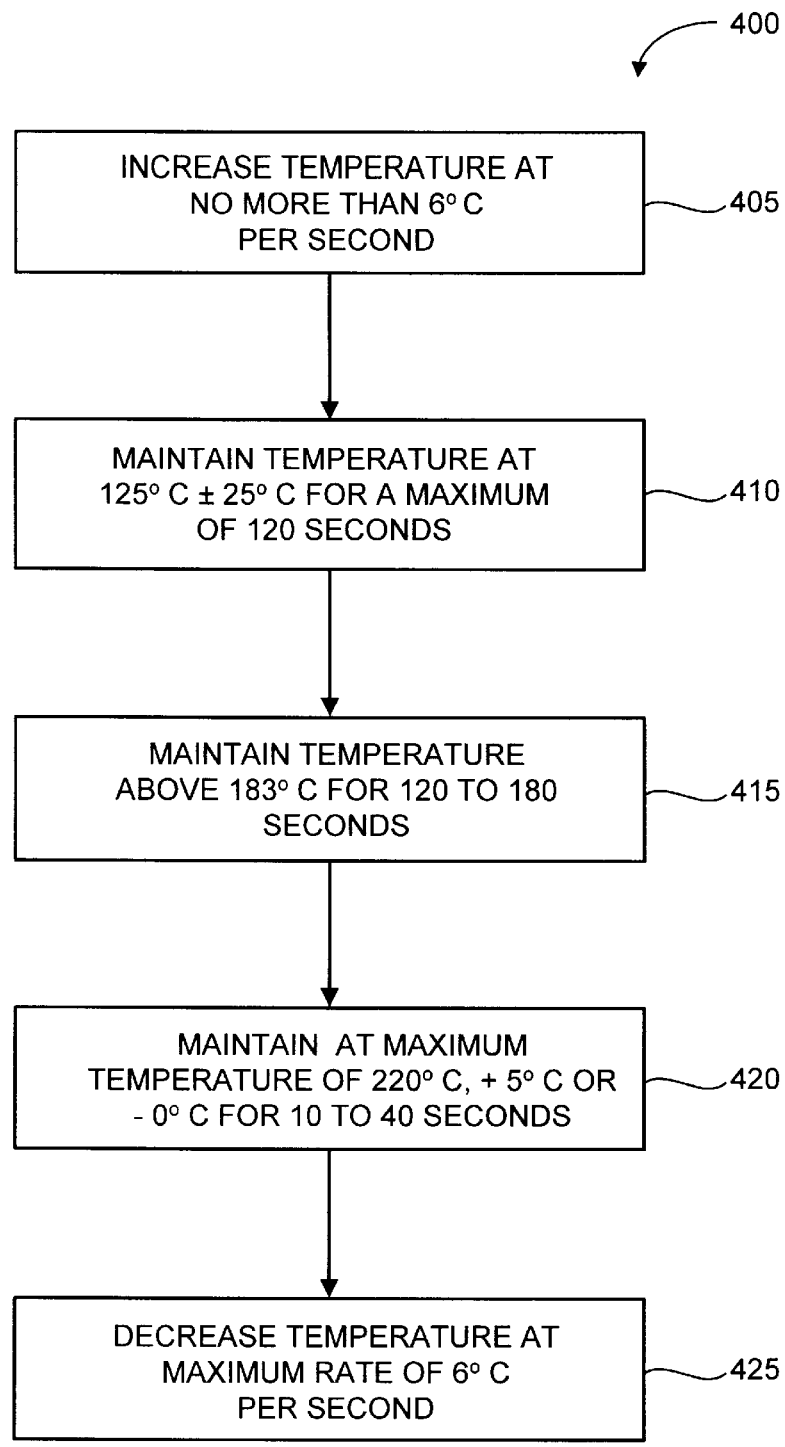
FIG. 4 is a flow diagram describing a method of simulating the card attach process in accordance with a preferred embodiment of the present invention.

Referring now to FIG. 4, a method 400 for simulating the card attach process as described in methods 200 and 300 is further illustrated. The steps of method 400 are sequenced to simulate the conditions of one typical card attach process 185. While most manufacturers use similar processes, the conditions for all card attach processes are not necessary identical to the steps depicted in FIG. 4. However, other, similar steps may be developed to simulate different card attach processes as used by various manufacturers. Method 400 uses an infrared (IR) furnace to heat the integrated circuit devices and follows the same protocols as card attach step 185. According to one standard card attach step 185, as specified by the JEDEC standard, the ambient temperature surrounding the integrated circuit modules increases no more than 6 degrees Celsius per second (step 405). The temperature is maintained at 125 degrees Celsius plus or minus 25 degrees for a maximum of 120 seconds (step 410). The temperature is maintained above 183 degrees Celsius for 120 to 180 seconds (step 415). The time at the maximum temperature is maintained for 10 to 40 seconds (step 420). Then, the maximum temperature reached is 220 degrees Celsius, plus 5 or minus 0 degrees Celsius (step 420). Finally, the temperature then decreases at a maximum rate of 6 degrees Celsius per second (step 425).

The methods of the present invention are designed to closely simulate the conditions that will occur during the subsequent card attach process and will allow previously undetected weak components to be isolated and removed from the manufacturing process, thereby increasing reliability and enhancing quality control. One skilled in the art will realize that the use of a card attach process different than that disclosed in FIG. 4 will require a different process to simulate the card attach process. For instance, heating methods other than an IR furnace may be used to heat the module during the card attach process, or a different heating protocol may be used. In such circumstances, it is within the spirit of the present invention to simulate whatever process (es) are used for card attach prior to burn-in to trigger manufacturing defects prior to shipment.

While the present invention has been particularly shown and described with reference to preferred embodiments thereof. It will be understood by those skilled in the art that various changes in form and details may be made therein without departing from the spirit and scope of the present invention. For instance, the thermal bump step may be introduced at points other than those indicated in either exemplary embodiment, so long as it occurs at a point that allows a subsequent reliability test step or process to detect the failures triggered by the thermal bump. Test processes other than burn-in testing may be used to detect circuit failures triggered by the thermal bump. The actual method of applying the card attach simulation may be varied from the method disclosed herein, so long as the thermal bump consists of heating or otherwise stressing a module and its components to trigger defects. If a card attach process step other than the current JEDEC standard described herein is used, any other suitable simulation of the selected card attach process which is implemented prior to the standard burn-in testing procedure is within the scope of the present invention.

I claim:

1. A method comprising the steps of:
   subjecting an integrated circuit module to an environment that simulates a card attach process step by raising ambient temperature to at least one temperature range that corresponds to a temperature range in the card attach process step; and
   performing reliability testing on the integrated circuit module to determine effects of raising the ambient temperature.

2. The method of claim 1 wherein the step of simulating the card attach process step comprises the step of subjecting the integrated circuit module to the same ambient temperatures for the same amount of time as the integrated circuit module will experience during the subsequent card attach process step.

3. The method of claim 1 wherein the step of simulating the card attach process step comprises the step of using the JEDEC standard to determine the at least one temperature range used to simulate the card attach process step.

4. The method of claim 1 wherein the step of subjecting the integrated circuit module to an environment that simulates the card attach process step comprises the step of using an infrared furnace to raise the ambient temperature surrounding the integrated circuit module.

5. The method of claim 1 wherein the step of performing reliability testing on the integrated circuit module comprises the step of performing burn-in testing.

6. The method of claim 1 further comprising the step of attaching the integrated circuit module to a card.

7. The method of claim 1 wherein the step of subjecting an integrated circuit module to an environment that simulates a card attach process step comprises the steps of:
   increasing the temperature of the integrated circuit module at a rate of at most 6 degrees Celsius per second;
   maintaining the temperature at approximately 125 degrees Celsius for at most 120 seconds;
   maintaining the temperature above 183 degrees Celsius for 120 to 180 seconds;
   maintaining the temperature at approximately 220 degrees Celsius for 10 to 40 seconds; and
   decreasing the temperature at a rate of at most 6 degrees per second.

8. The method of claim 7 wherein the step of maintaining the temperature at approximately 125 degrees Celsius comprises the step of maintaining the temperature between 100 degrees Celsius and 150 degrees Celsius.

9. The method of claim 7 wherein the step of maintaining the temperature at approximately 220 degrees Celsius comprises the step of maintaining the temperature between 200 degrees Celsius and 225 degrees Celsius.

10. A method for identifying defective integrated circuit modules, the method comprising the steps of:
    subjecting a plurality of integrated circuit modules to an environment that simulates a card attach process step by raising ambient temperature to at least one temperature range that corresponds to a temperature range in the card attach process step;
    performing reliability testing on the plurality of integrated circuit modules to determine effects of raising the ambient temperature;
    identifying at least one defective integrated circuit module as a result of the burn-in testing process step;
    removing the at least one defective integrated circuit module from the plurality of integrated circuit modules; and
    attaching the remainder of the plurality of integrated circuit modules to a plurality of cards.

11. The method of claim 10 wherein the step of simulating the card attach process step comprises the step of subjecting the plurality of integrated circuit modules to the same ambient temperature for the same amount of time as the plurality of integrated circuit modules will experience during the step of attaching the remainder of the plurality of integrated circuit modules to a plurality of cards.

12. The method of claim 10 wherein the step of simulating the card attach process step comprises the step of using t the JEDEC standard to determine the at least one temperature range used to simulate the card attach process step.

13. The method of claim 10 wherein the step of subjecting the plurality of integrated circuit modules to an environment that simulates the card attach process step comprises the step of using an infrared furnace to raise the ambient temperature surrounding the plurality of integrated circuit modules.

14. The method of claim 10 wherein the step of performing reliability testing on the plurality of integrated circuit modules comprises the step of supplying the integrated circuit module with a voltage exceeding its expected operating voltage.

15. The method of claim 10 wherein the step of subjecting a plurality of integrated circuit modules to an environment that simulates a card attach process step comprises the steps of:
    increasing the ambient temperature surrounding the plurality of integrated circuit modules at a rate of at most 6 degrees Celsius per second;
    maintaining the ambient temperature at approximately 125 degrees Celsius for at most 120 seconds;
    maintaining the ambient temperature above 183 degrees Celsius for 120 to 180 seconds;
    maintaining the ambient temperature at approximately 220 degrees Celsius for 10 to 40 seconds; and
    decreasing the ambient temperature at a rate of at most 6 degrees per second.

16. The method of claim 10 wherein the step of performing reliability testing on the plurality of integrated circuit modules comprises the step of performing burn-in testing on the plurality of integrated circuit modules.

17. The method of claim 15 wherein the step of maintaining the temperature at approximately 125 degrees Celsius comprises the step of maintaining the temperature between 100 degrees Celsius and 150 degrees Celsius.

18. The method of claim 15 wherein the step of maintaining the temperature at approximately 220 degrees Celsius comprises the step of maintaining the temperature between 200 degrees Celsius and 225 degrees Celsius.

19. A method for identifying defective integrated circuit modules, the method comprising the steps of:
    a) placing a plurality of integrated circuit modules into an infrared oven;
    b) subjecting an integrated circuit module to an environment that simulates a card attach process step by raising the ambient temperature, the step of subjecting an integrated circuit module to an environment that simulates a card attach process step comprising the steps of:
       i) increasing the ambient temperature surrounding the plurality of integrated circuit modules at a rate of at most 6 degrees Celsius per second until the ambient temperature reaches approximately 125 degrees Celsius;
       ii) maintaining the ambient temperature at approximately 125 degrees Celsius for at most 120 seconds;

iii) increasing the ambient temperature at a rate of at most 6 degrees Celsius per second until the temperature exceeds 183 degrees Celsius;

iv) maintaining the ambient temperature above 183 degrees Celsius for 120 to 180 seconds;

v) increasing the ambient temperature at a rate of at most 6 degrees Celsius per second to approximately 220 degrees Celsius;

vi) maintaining the ambient temperature at approximately 220 degrees Celsius for 10 to 40 seconds; and vii) decreasing the ambient temperature at a rate of at most 6 degrees per second;

c) supplying the plurality of integrated circuit modules with a voltage exceeding the expected operating voltage for the plurality of integrated circuit modules; and d) attaching the plurality of integrated circuit modules to a plurality of cards after the step of subjecting an integrated circuit module to an environment that simulates a card attach process step.

20. The method of claim 19 wherein the step of maintaining the temperature at approximately 125 degrees Celsius comprises the step of maintaining the temperature between 100 degrees Celsius and 150 degrees Celsius.

21. The method of claim 19 wherein the step of maintaining the temperature at approximately 220 degrees Celsius comprises the step of maintaining the temperature between 200 degrees Celsius and 225 degrees Celsius.

* * * * *